US009633901B2

(12) United States Patent
Soeno et al.

(10) Patent No.: US 9,633,901 B2
(45) Date of Patent: Apr. 25, 2017

(54) METHOD FOR MANUFACTURING SEMICONDUCTOR DEVICE

(71) Applicant: Toyota Jidosha Kabushiki Kaisha, Toyota-shi, Aichi-ken (JP)

(72) Inventors: Akitaka Soeno, Toyota (JP); Sachiko Aoi, Nagakute (JP); Shinichiro Miyahara, Nagoya (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 14/803,500

(22) Filed: Jul. 20, 2015

(65) Prior Publication Data

US 2016/0027662 A1 Jan. 28, 2016

(30) Foreign Application Priority Data

Jul. 22, 2014 (JP) ................. 2014-149140

(51) Int. Cl.
*H01L 21/326* (2006.01)
*H01L 21/78* (2006.01)
(Continued)

(52) U.S. Cl.
CPC .......... *H01L 21/78* (2013.01); *H01L 21/6835* (2013.01); *H01L 21/6836* (2013.01);
(Continued)

(58) Field of Classification Search
CPC ..... H01L 21/78; H01L 22/14; H01L 29/7395; H01L 21/6835; H01L 22/20; H01L 21/6836; H01L 22/32
See application file for complete search history.

(56) References Cited

U.S. PATENT DOCUMENTS 6,156,584 A * 12/2000 Itoh .................... H01L 33/0095
438/33
6,518,079 B2 * 2/2003 Imler .................. H01L 33/0095
257/E21.599
(Continued)

FOREIGN PATENT DOCUMENTS

JP S61-43441 A 3/1986
JP H06-37160 A 2/1994
(Continued)

*Primary Examiner* — Savitr Mulpuri
(74) *Attorney, Agent, or Firm* — Dinsmore & Shohl LLP

(57) ABSTRACT

A method for manufacturing a semiconductor device is provided. The method includes forming a first semiconductor element and a second semiconductor element in a semiconductor wafer. The first semiconductor element includes a first electrode formed on a front surface of the semiconductor wafer. The second semiconductor element is adjacent to the first semiconductor element and includes a second electrode formed on the front surface. The method further includes forming a first insulating layer on the front surface located at a first boundary portion between the first electrode and the second electrode; applying a specific potential different from a potential of the second electrode on the first electrode after the formation of the first insulating layer; and cutting the semiconductor wafer at the first boundary portion so as to divide the first semiconductor element from the second semiconductor element.

10 Claims, 12 Drawing Sheets

(51) Int. Cl.
*H01L 21/683* (2006.01)
*H01L 21/66* (2006.01)
*H01L 29/739* (2006.01)

(52) U.S. Cl.
CPC .............. *H01L 22/20* (2013.01); *H01L 22/14* (2013.01); *H01L 29/7395* (2013.01)

(56) References Cited

U.S. PATENT DOCUMENTS

| | | | | |
|---|---|---|---|---|
| 6,716,656 | B2* | 4/2004 | Shtein | C23C 14/042 438/24 |
| 7,262,617 | B2* | 8/2007 | Komatsu | G01R 31/2891 324/750.25 |
| 7,271,014 | B2* | 9/2007 | Sato | G01R 31/2889 257/E21.001 |
| 7,829,889 | B2* | 11/2010 | Lehr | H01L 21/31116 257/48 |
| 8,101,433 | B2* | 1/2012 | Akiba | H01L 22/20 257/773 |
| 8,257,985 | B2* | 9/2012 | Stevenson | B81C 1/00333 257/E21.238 |
| 8,309,373 | B2* | 11/2012 | Abiru | H01L 22/32 257/E21.231 |
| 9,136,352 | B2* | 9/2015 | Niimura | H01L 29/0878 |
| 2008/0054260 | A1 | 3/2008 | Ishitobi et al. | |
| 2011/0193200 | A1* | 8/2011 | Lyne | H01L 22/20 257/622 |
| 2012/0238044 | A1* | 9/2012 | Shibata | H01L 21/6835 438/17 |

FOREIGN PATENT DOCUMENTS

| | | |
|---|---|---|
| JP | 2010-177290 A | 8/2010 |
| JP | 2012-195539 A | 10/2012 |
| WO | 2006-025140 A1 | 3/2006 |

* cited by examiner

METHOD FOR MANUFACTURING SEMICONDUCTOR DEVICE

CROSS-REFERENCE TO RELATED APPLICATION

This application claims priority to Japanese Patent Application No. 2014-149140 filed on Jul. 22, 2014, the contents of which are hereby incorporated by reference into the present application.

TECHNICAL FIELD

A technique disclosed herein relates to a method for manufacturing a semiconductor device.

DESCRIPTION OF RELATED ART

Japanese Patent Application Publication No. 2010-177290 discloses a method for inspecting plural semiconductor elements formed on a semiconductor wafer. In this method, the inspection is executed by energizing some semiconductor elements among plural semiconductor elements.

BRIEF SUMMARY

When some semiconductor elements among plural semiconductor elements formed in a semiconductor wafer are energized, electric discharge may occur from an electrode of the semiconductor element being an inspection target to an electrode of an adjacent semiconductor element not being the inspection target, and an occurrence of such a situation is problematic. A method is therefore provided herein for manufacturing a semiconductor device, that energizes a semiconductor element among plural semiconductor elements formed in a semiconductor wafer, and that is capable of suppressing an occurrence of electric discharge from the energized semiconductor element to the adjacent semiconductor elements when the semiconductor element energization is performed.

A method for manufacturing a semiconductor device is disclosed herein. The method comprises forming first and second semiconductor elements, forming a first insulating layer, applying a specific potential, and cutting a semiconductor wafer.

In the formation of the first and second semiconductor elements, the first and second semiconductor elements are formed in the semiconductor wafer. The first semiconductor element includes a first electrode formed on a front surface of the semiconductor wafer. The second semiconductor element is adjacent to the first semiconductor element and includes a second electrode formed on the front surface. In the formation of the first insulating layer, the first insulating layer is formed on the front surface located at a first boundary portion between the first electrode and the second electrode. In the application of the specific potential, the specific potential different from a potential of the second electrode is applied on the first electrode after the formation of the first insulating layer. In the cutting of the semiconductor wafer, the semiconductor wafer is cut at the first boundary portion so as to divide the first semiconductor element from the second semiconductor element.

According to this method, the specific potential is applied to the first electrode after the first insulating layer is formed on the front surface of the semiconductor wafer located in the first boundary portion between the first electrode and the second electrode. The first insulating layer therefore suppresses an occurrence of electric discharge between the first electrode and the second electrode when the specific potential is applied.

DETAILED DESCRIPTION

Figure 1:
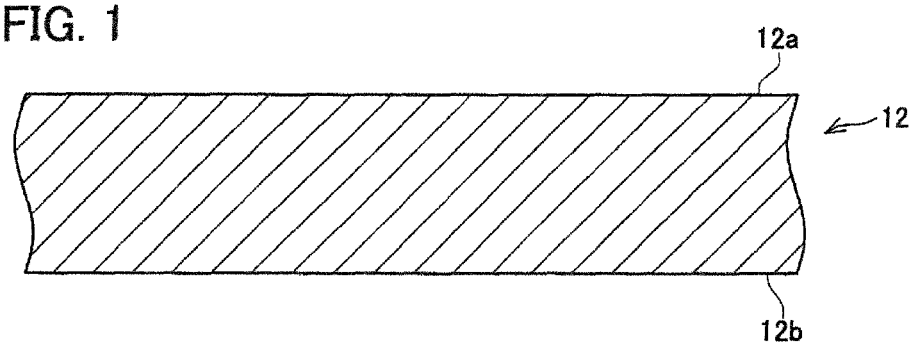
FIG. 1 is a vertical cross-sectional diagram of a semiconductor wafer 12 before processing.

Features of a method for manufacturing a semiconductor device of a first embodiment will first be listed. The features are each independently useful.

(Feature 1) The method may further comprise removing at least a part of a first insulating layer after application of a specific potential so as to expose at least a part of a front surface of a semiconductor wafer located in a first boundary portion. In cutting of the semiconductor wafer, a region of the semiconductor wafer including the exposed front surface in the first boundary portion may be cut. According to this configuration, in the cutting of the semiconductor wafer, the semiconductor wafer can advantageously be cut because the region including the front surface exposed by removing the first insulating layer is cut.

(Feature 2) In formation of the first insulating layer, the first insulating layer may be formed so that a part of a first electrode located on a first boundary portion side is covered with the first insulating layer. In the application of the specific potential, a probe may be caused to make contact with an exposed region of the first electrode so as to apply the specific potential on the first electrode. In the removal of at least the part of the first insulating layer, at least a part of the first insulating layer located on the first electrode may be removed so as to enlarge the exposed region of the first electrode. According to this configuration, an occurrence of electric discharge becomes further less likely to take place between the first electrode and a second electrode because the specific potential is applied in a state in which the part of the first electrode on the first boundary portion side is covered with the first insulating layer. Further, heat dissipation property of the first semiconductor element can be improved because the exposed region of the first electrode with which the probe was in contact is enlarged after the application of the specific potential.

(Feature 3) The first semiconductor element may further include a fourth electrode formed on the front surface and located at an opposite side from the second electrode with respect to the first electrode. In the formation of the first insulating layer, a second insulating layer may be further formed on the front surface located in a clearance between the first electrode and the fourth electrode so that a part of the first electrode on a clearance side is covered with the second insulating layer. In the application of the specific potential, a distance from an edge of the exposed region of the first electrode on the first boundary portion side to an edge of the first electrode on the first boundary portion side may be longer than a distance from an edge of the exposed region of the first electrode on the clearance side to an edge of the first electrode on the clearance side. An occurrence of electric discharge becomes further less likely to take place by setting the distance from the exposed region of the first electrode to the first boundary portion to be longer as above.

(Feature 4) In the formation of the first semiconductor element and the second semiconductor element, a third semiconductor element may be further formed in the semiconductor wafer. The third semiconductor element may be adjacent to the first semiconductor element at an opposite side from the second semiconductor element, and may include a third electrode formed on the front surface. In the formation of the first insulating layer, a third insulating layer may be further formed on the front surface located in a second boundary portion between the third electrode and the fourth electrode so that a part of the fourth electrode on a second boundary portion side is covered with the third insulating layer. The second insulating layer may be formed so that a part of the fourth electrode on the clearance side is covered with the second insulating layer. In the application of the specific potential, a probe may be caused to make contact with an exposed region of the fourth electrode so as to further apply the specific potential on the fourth electrode. A distance from an edge of the exposed region of the fourth electrode on the second boundary portion side to an edge of the fourth electrode on the second boundary portion side may be longer than a distance from an edge of the exposed region of the fourth electrode on the clearance side to an edge of the fourth electrode on the clearance side. In the removal of at least the part of the first insulating layer, at least a part of the third insulating layer may be further removed so as to expose at least a part of the front surface located in the second boundary portion and enlarge the exposed region of the fourth electrode. In the cutting of the semiconductor wafer, a region of the semiconductor wafer including the exposed front surface in the second boundary portion may be cut so as to divide the first semiconductor element from the third semiconductor element. According to this configuration, electric discharge can advantageously be suppressed between the fourth electrode and the third electrode.

(Feature 5) In the removal of at least the part of the first insulating layer, the first insulating layer may be sputtered through a mask having an opening located above the first insulating layer located on the first boundary portion and an opening located above the exposed region of the first electrode. The method may further comprise growing a metal layer on the exposed region of the first electrode through the mask after the removal of at least the part of the first insulating layer and before the cutting of the semiconductor wafer. According to this configuration, the sputtering of the first insulating layer and the growth of the metal layer can be executed using the same mask.

(Feature 6) The first semiconductor element may further include a rear surface electrode formed on a rear surface of the semiconductor wafer. In the application of the specific potential, a potential different from the specific potential may be applied on the rear surface electrode.

First Embodiment

In a manufacturing method of each of embodiments, a semiconductor device is manufactured from a semiconductor wafer 12 depicted in FIG. 1. For example, an n-type SiC wafer is usable as a semiconductor wafer 12.

Figure 2:
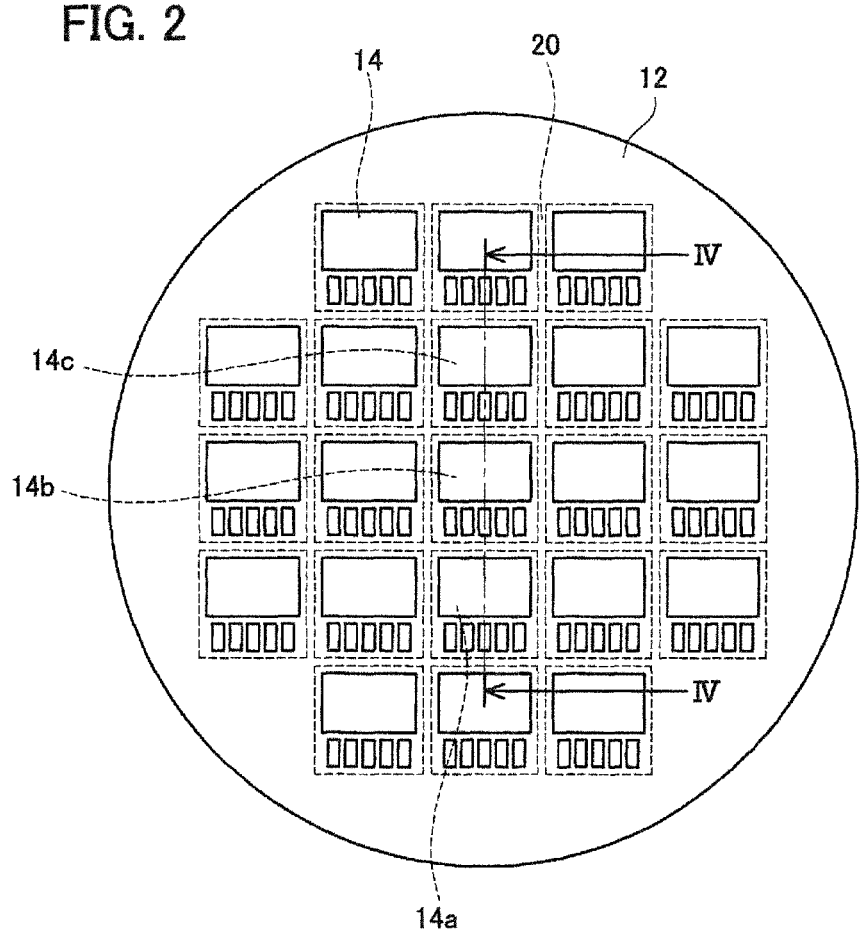
FIG. 2 is a plan diagram of the semiconductor wafer 12 after a semiconductor element formation step.
Figure 3:
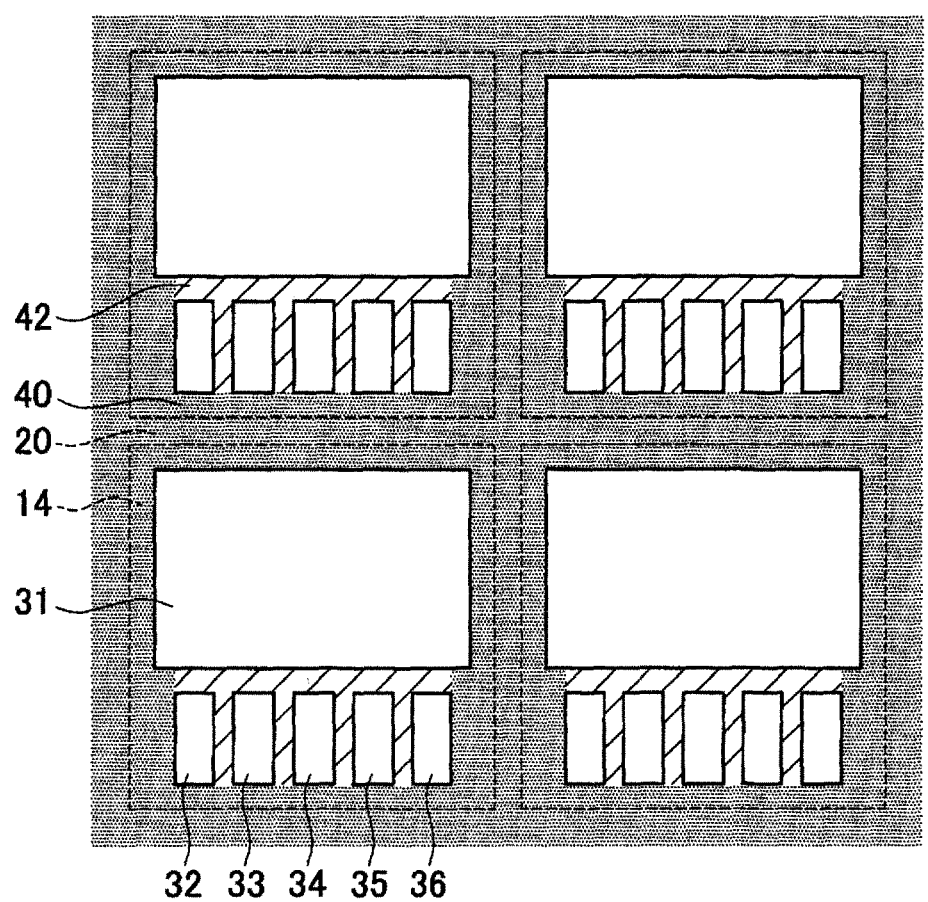
FIG. 3 is an enlarged diagram of a top surface of semiconductor elements 14.
Figure 4:
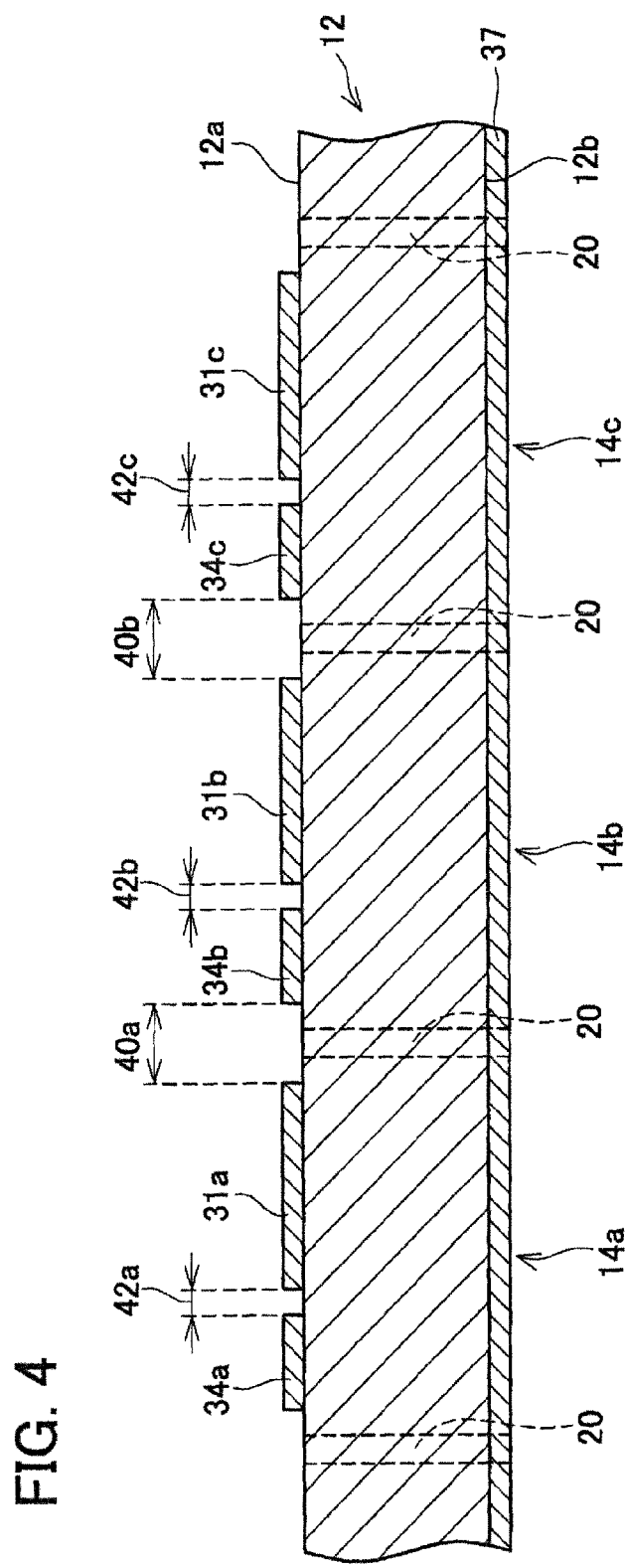
FIG. 4 is a vertical cross-sectional diagram of the semiconductor wafer 12 along an IV-IV line of FIG. 2.

(Semiconductor Element Formation Step) Plural semiconductor elements 14 are formed in the semiconductor wafer 12 as depicted in FIG. 2 by forming p-type diffusion layers, n-type diffusion layers, electrodes, insulating layers, etc., in the semiconductor wafer 12. In FIG. 2, each region surrounded by a dotted line is the semiconductor element 14, and each narrow region located between the adjacent semiconductor elements 14 is a region 20 (that is, a dicing line) to be cut off in a dicing step performed later. In this embodiment, each of the semiconductor elements 14 is an IGBT. As depicted in FIG. 3, each of the semiconductor elements 14 includes electrodes 31 to 36 formed on a top surface 12a of the semiconductor wafer 12. The electrode 31 being the largest electrode is an emitter electrode. The small electrodes 32 to 36 are formed next to the electrode 31. The electrode 34 in the center of the electrodes 32 to 36 is a gate electrode. The electrodes 32, 33, 35, and 36 are electrodes configured to detect a current and a temperature of the semiconductor element 14. In FIGS. 2 and 3, the semiconductor elements 14 are formed in a same orientation (that is, an orientation in which the emitter electrode 31 is located on an upper side in FIGS. 2 and 3). Hereinafter, a region between the electrodes 31 to 36 of one semiconductor element 14 and the electrodes 31 to 36 of its adjacent semiconductor element 14 will be referred to as a "boundary portion 40". In FIGS. 2 and 3, the boundary portions 40 are indicated by dot-hatching. Each of the dicing lines 20 is arranged in corresponding one of the boundary portions 40. Hereinafter, a region among the electrodes 31 to 36 in one semiconductor element 14 will be referred to as a "clearance 42". In FIG. 3, the clearances 42 are indicated by slash-hatching. FIG. 4 depicts a vertical cross-sectional diagram of the semiconductor elements 14a to 14c (see FIG. 2) of the plural semiconductor elements 14. The semiconductor element 14a is adjacent to the semiconductor element 14b. The semiconductor element 14c is adjacent to the semiconductor element 14b on a side opposite to the semiconductor element 14a. That is, the semiconductor element 14b is disposed between the semiconductor element 14a and the semiconductor element 14c. As depicted in FIG. 4, the top surface 12a of the semiconductor wafer 12 is exposed at the boundary portions 40. As depicted in FIG. 4, a bottom surface electrode 37 is formed on an entirety of the bottom surface 12b of the semiconductor wafer 12. The bottom surface electrode 37 is a collector electrode of the IGBT.

Hereinafter, the electrodes 31 and 34 of the semiconductor element 14a will respectively be referred to as "electrodes 31a, 34a", the electrodes 31 and 34 of the semiconductor element 14b will respectively be referred to as "electrodes 31b, 34b", and the electrodes 31 and 34 of the semiconductor element 14c will respectively be referred to as "electrodes 31c, 34c". Further, hereinafter, the boundary portion 40 between the electrode 31a and the electrode 34b will be referred to as "boundary portion 40a", and the boundary portion 40 between the electrode 31b and the electrode 34c will be referred to as "boundary portion 40b". Further, hereinafter, the clearance 42 of the semiconductor element 14a will be referred to as "clearance 42a", the clearance 42 of the semiconductor element 14b will be referred to as "clearance 42b", and the clearance 42 of the semiconductor element 14c will be referred to as "clearance 42c".

Figure 5:
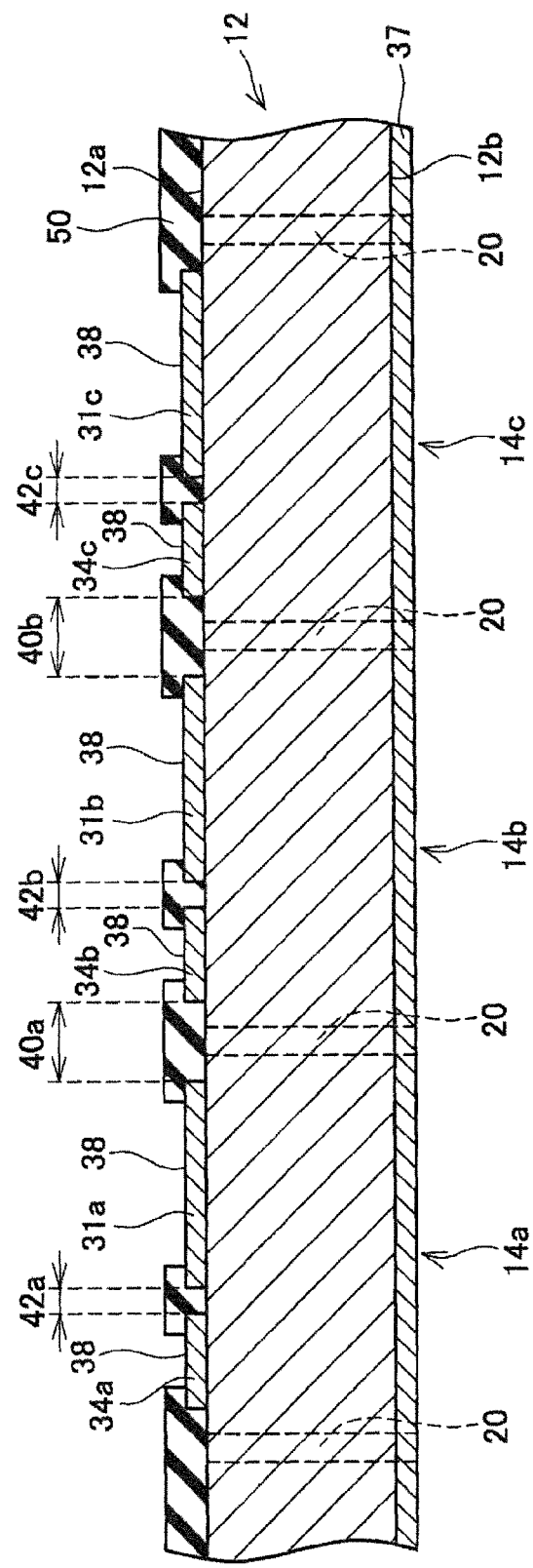
FIG. 5 is a vertical cross-sectional diagram of the semiconductor wafer 12 corresponding to that of FIG. 4 after an insulating layer formation step of a first embodiment.

(Insulating Layer Formation Step) As depicted in FIG. 5, an insulating layer 50 is formed on the semiconductor wafer 12. In this embodiment, the insulating layer 50 is formed of polyimide. The insulating layer 50 is formed on the boundary portions 40, the clearances 42, and peripheries of these. At this stage, the insulating layer 50 is not completely hardened and is in its temporary hardening state (a state where the insulating layer 50 can easily be removed by etching).

At each of the boundary portions 40, the insulating layer 50 is formed so that the insulating layer 50 covers the overall top surface 12a of the semiconductor wafer 12 that is exposed on the boundary portion 40. Further, on the boundary portion 40, the insulating layer 50 is formed so that the insulating layer 50 covers parts of the electrodes 31 on a boundary portion 40 side and parts of the electrodes 34 on the boundary portion 40 side. For example, in FIG. 5, a part of the electrode 31a on a boundary portion 40a side is covered by the insulating layer 50 extending from the boundary portion 40a, and a part of the electrode 34b on a boundary portion 40a side is covered by the insulating layer 50 extending from the boundary portion 40a. Similarly, a part of the electrode 31b on a boundary portion 40b side is covered by the insulating layer 50 extending from the boundary portion 40b, and a part of the electrode 34c on a boundary portion 40b side is covered by the insulating layer 50 extending from the boundary portion 40b. Also, each part of the other electrodes 32, 33, 35, and 36 on a boundary portion 40 side is also covered by the insulating layer 50.

In each of the clearances 42, the insulating layer 50 is formed so that the insulating layer 50 covers the overall top surface 12a of the semiconductor wafer 12 that is exposed on the clearance 42. In each clearance 42, the insulating layer 50 is formed so that the insulating layer 50 covers a part of the electrode 31 on a clearance 42 side, and a part of the electrode 34 on a clearance 42 side. For example, in FIG. 5, a part of the electrode 34a on a clearance 42a side is covered by the insulating layer 50 extending from the clearance 42a, and a part of the electrode 31a on a clearance 42a side is covered by the insulating layer 50 extending from the clearance 42a. Similarly, a part of the electrode 34b on a clearance 42b side is covered by the insulating layer 50 extending from the clearance 42b, and a part of the electrode 31b on a clearance 42b side is covered by the insulating layer 50 extending from the clearance 42b. Similarly, a part of the electrode 34c on a clearance 42c side of the electrode 34c is covered by the insulating layer 50 extending from the clearance 42c, and a part of the electrode 31c on a clearance 42c side is covered by the insulating layer 50 extending from the clearance 42c. Also, each part of the other electrodes 32, 33, 35, and 36 on a clearance 42 side is also covered by the insulating layer 50.

On the insulating layer 50 on the electrodes 31 to 36, a gap is formed each between the insulating layer 50 extending from the boundary portion 40 and the insulating layer 50 extending from the clearance 42, and an exposed region 38 in which each of the electrodes 31 to 36 is exposed is formed in the gap. For example, in FIG. 5, on the electrodes 31 and 34, a gap is formed each between the insulating layer 50 extending from the boundary portion 40 and the insulating layer 50 extending from the clearance 42. The exposed region 38 in which each of the electrodes 31a to 31c and 34a to 34c is exposed is formed in the gap.

Figure 6:
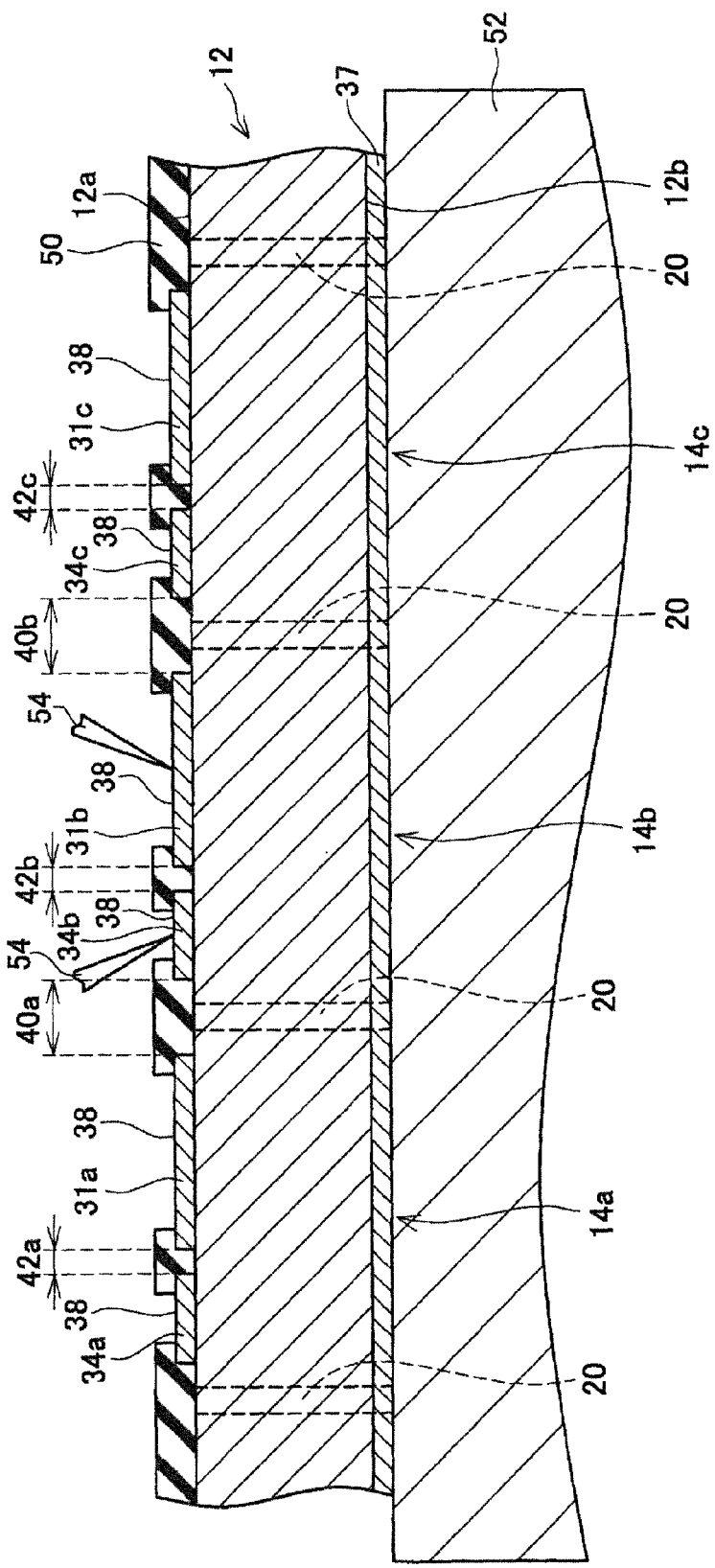
FIG. 6 is an explanatory diagram of an inspection step of the first embodiment.

(Inspection Step) As depicted in FIG. 6, the semiconductor wafer 12 is placed on a stage 52. By applying a voltage to one of the plural semiconductor elements 14, an inspection is executed as to whether the semiconductor element 14 has a required withstand voltage property. In the inspection, probes 54 are first caused to make contact with each of the electrodes 31 to 36 on the top surface side of the semiconductor element 14 being an inspection target. For example, when the semiconductor element 14b is an inspection target, the probes 54 are caused to make contact with the electrodes 31b and 34b as depicted in FIG. 6. Notably, the probes 54 are also caused to make contact with the other electrodes 32, 33, 35, and 36 on the top surface side of the semiconductor element 14b. A low potential (for example, a ground potential) is applied to the stage 52 and a specific potential (for example, a high potential equal to or higher than 1,000 V) is applied to all the probes 54. Thereby, a high voltage is applied between the electrodes 31 to 36 on the top surface side of the semiconductor element 14 and the bottom surface electrode 37. A current flowing through the semiconductor element 14 being the inspection target is detected in a state that the high voltage is applied as described above. Thereby, an inspection as to whether or not the semiconductor element 14 being the inspection target has the required withstand voltage property is performed. At the inspection step, the above inspection is sequentially executed for each of the semiconductor elements 14 one by one.

At the inspection step, no probe 54 is connected to the electrodes 31 to 36 on the top surface side of the semiconductor elements 14 which are not an inspection target. Thus at the inspection step, the electrodes 31 to 36 on the top surface side of the semiconductor elements 14 which are not an inspection target are electrically floating. When the specific potential is applied to the electrodes 31 to 36 on the top surface side of the semiconductor element 14 being the inspection target, a potential of the electrodes 31 to 36 on the top surface side of the semiconductor element 14 which are not an inspection target and are adjacent to the semiconductor element 14 being the inspection target, becomes lower than the specific potential. A high potential difference is therefore generated between the electrodes 31 to 36 on the top surface side of the semiconductor element 14 being the inspection target and the electrodes 31 to 36 on the top surface side of the semiconductor element 14 which are not an inspection target, and are adjacent to the semiconductor element 14 being the inspection target. For example, when the semiconductor element 14b is an inspection target as in FIG. 6, a high potential difference is generated between the electrode 34b of the semiconductor element 14b and the electrode 31a of the semiconductor element 14a, and a high potential difference is generated between the electrode 31b of the semiconductor element 14b and the electrode 34c of the semiconductor element 14c. When electric discharge occurs in the boundary portion 40 due to the high potential difference generated as above between the adjacent semiconductor elements 14 during the inspection step, degradation is caused in properties of the semiconductor element 14, and this is problematic. In the method of this embodiment, however, the insulating layer 50 is formed on each of the boundary portions 40 between the adjacent semiconductor elements 14 and occurrence of electric discharge is less likely to take place in the boundary portion 40 due to the insulating layer 50. Especially, the insulating layer 50 is formed so as to cover a part of an upper portion of each of the electrodes 31 to 36 and, thereby, a distance between the exposed regions 38 of the adjacent electrodes (for example, between the exposed region 38 of the electrode 31a and the exposed region 38 of the electrode 34b). Thereby, the occurrence of electric discharge is less likely to take place in the boundary portions 40. According to the method of this embodiment, the occurrence of electric discharge can advantageously be suppressed between the adjacent semiconductor elements 14 in the inspection step.

Figure 7:
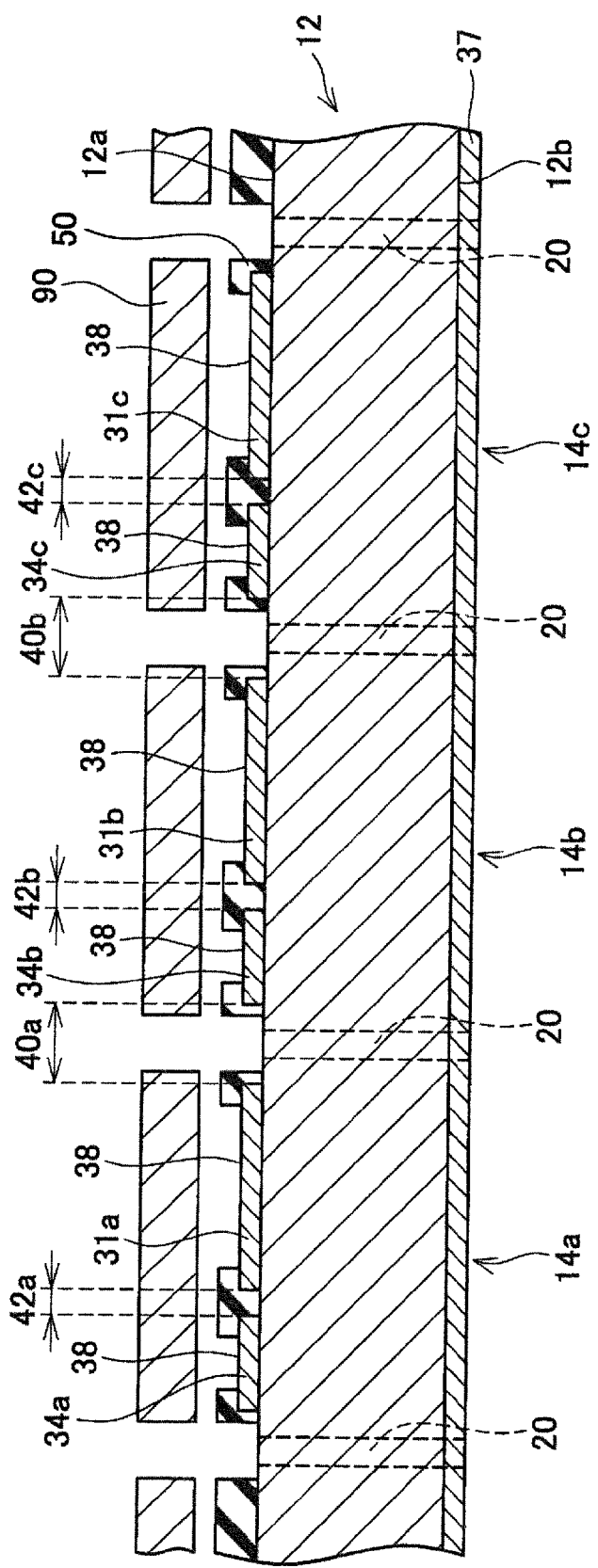
FIG. 7 is an explanatory diagram of an insulating layer removal step of the first embodiment.

(Insulating Layer Removal Step) As depicted in FIG. 7, the insulating layer 50 is sputtered through a mask 90. The mask 90 includes openings. At this step, the openings are located above the dicing lines 20. The insulating layer 50 in the boundary portions 40 is partially removed by sputtering the insulating layer 50 through the mask 90. The insulating layer 50 is removed so that the front surface 12a of the semiconductor wafer 12 on the dicing lines 20 is exposed. The insulating layer 50 is caused to remain between each of the electrodes 31 and each of the dicing lines 20, and between each of the electrodes 34 and each of the dicing lines 20. The insulating layer 50 caused to remain in this manner acts as a protective film that protects a surface of an outer circumferential portion of each of the semiconductor elements 14. After exposing the dicing lines 20, the insulating layer 50 in its temporary hardening state is completely hardened by baking the semiconductor wafer 12.

(Dicing Step) The semiconductor wafer 12 is divided into the individual semiconductor elements 14 by cutting the semiconductor wafer 12 along the dicing lines 20. The insulating layer 50 on the dicing lines 20 has been removed as mentioned above. The cutting of the semiconductor wafer 12 along the dicing lines 20 is therefore equivalent to cutting of the semiconductor wafer 12 along the top surface 12a which was exposed in the insulating layer removal step. Since the insulating layer 50 is not present on the dicing lines 20, the insulating layer 50 is not undesirably entangled in a dicing blade. This results in less likelihood of defects in a portion of the semiconductor wafer 12 that is cut by the dicing blade. The semiconductor wafer 12 can therefore advantageously be cut.

A semiconductor device including the semiconductor elements 14 is manufactured according to the above steps. As described above, according to this method, electric discharge can be suppressed in the boundary portions 40 because the inspection step is executed with the insulating layer 50 present on the boundary portions 40. Further, the dicing step can advantageously be executed because the insulating layer 50 on the dicing lines 20 is removed after the inspection step.

Second Embodiment (Semiconductor Element Formation Step) A method of a second embodiment will be described. A semiconductor element formation step of the second embodiment is executed similarly to the semiconductor element formation step of the first embodiment.

Figure 8:
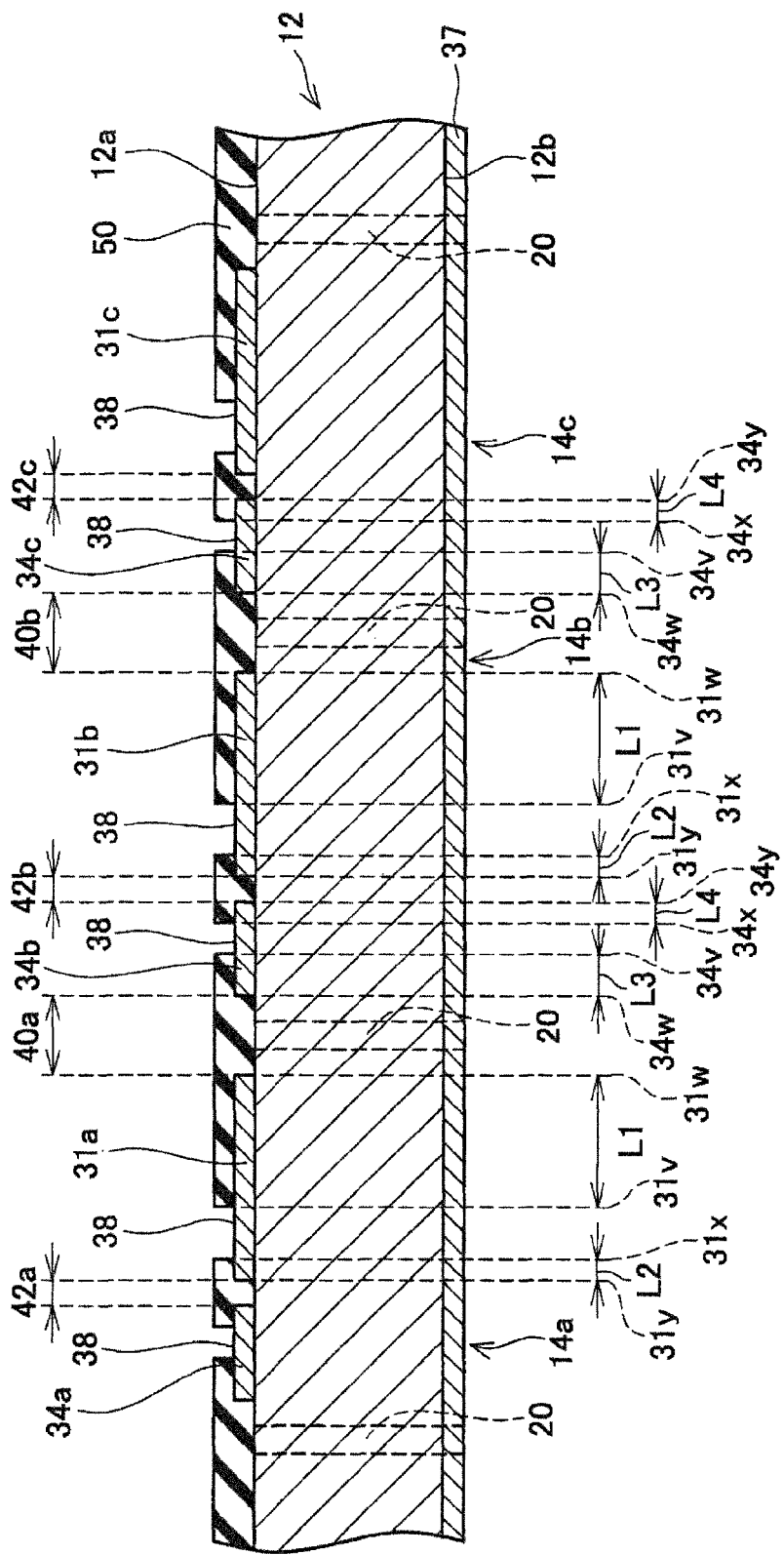
FIG. 8 is a vertical cross-sectional diagram of the semiconductor wafer 12 corresponding to that of FIG. 4 after an insulating layer formation step of a second embodiment.

(Insulating Layer Formation Step) At an insulating layer formation step, the insulating layer 50 is formed similarly to that of the insulating layer formation step of the first embodiment. As depicted in FIG. 8, however, the insulating layer 50 is formed so that a width of the insulating layer 50 extending from the boundary portion 40 onto the electrode 31 and a width of the insulating layer 50 extending from the boundary portion 40 onto the electrode 34 are wider than those of the first embodiment. More specifically, the insulating layer 50 is formed so that a distance L1 from an edge 31v of the exposed region 38 of the electrode 31 on a boundary portion 40 side to an edge 31w of the electrode 31 on the boundary portion 40 side is longer than a distance L2 from an edge 31x of the exposed region 38 of the electrode 31 on a clearance 42 side to an edge 31y of the electrode 31 on the clearance 42 side. In other words, the insulating layer 50 is formed so that the exposed region 38 of the electrode 31 is located at a position closer to the clearance 42 than to the boundary portion 40. Further, the insulating layer 50 is formed so that a distance L3 from an edge 34v of the exposed region 38 of the electrode 34 on a boundary portion 40 side to an edge 34w of the electrode 34 on the boundary portion 40 side is longer than a distance L4 from an edge 34x of the exposed region 38 of the electrode 34 on a clearance 42 side to an edge 34y of the electrode 34 on the clearance 42 side. In other words, the insulating layer 50 is formed so that the exposed region 38 of the electrode 34 is located at a position closer to the clearance 42 than to the boundary portion 40. For each of the other electrodes 32, 33, 35, and 36, the exposed region 38 is arranged at a position closer to the clearance 42 than to the boundary portion 40.

Figure 9:
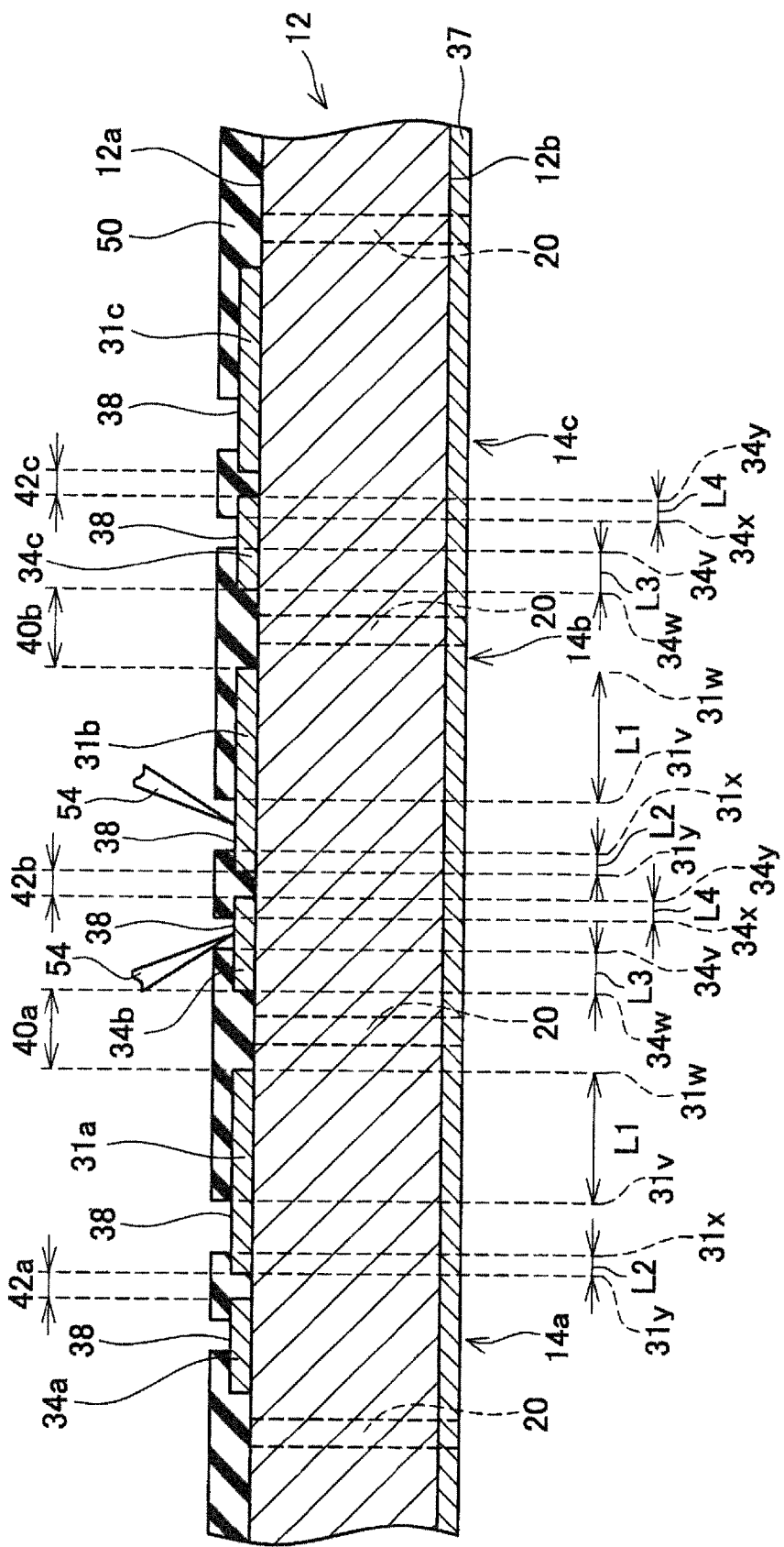
FIG. 9 is an explanatory diagram of an inspection step of the second embodiment.

(Inspection Step) At an inspection step, the semiconductor elements 14 are each inspected similarly to that of the inspection step of the first embodiment. FIG. 9 depicts an inspection executed for the semiconductor element 14b. In the inspection executed for the semiconductor element 14b, the probes 54 are caused to make contact with the exposed regions 38 of the electrodes 31b and 34b such that the specific potential is applied to each of the electrodes 31b and 34b. At this time, a distance between the exposed region 38 of the electrode 31b and the exposed region 38 of the electrode 34c is longer than that of the first embodiment because the exposed region 38 of the electrode 31b is positioned at a position close to the clearance 42b and the exposed region 38 of the electrode 34c is positioned at a position close to the clearance 42c. Thereby, the occurrence of electric discharge can be more advantageously suppressed between the electrode 31b and the electrode 34c. Preferably, the distance between the exposed regions is equal to or larger than 800 μm. Further, a distance between the exposed region 38 of the electrode 34b and the exposed region 38 of the electrode 31a is longer than that of the first embodiment because the exposed region 38 of the electrode 34b is positioned at a position close to the clearance 42b and the exposed region 38 of the electrode 31a is positioned at a position close to the clearance 42a. Thereby, the occurrence of electric discharge can further advantageously be suppressed between the electrode 34b and the electrode 31a. Preferably, this distance between the exposed regions is equal to or larger than 800 μm. For each of the other electrodes 32, 33, 35, and 36 on the top surface side of the semiconductor element 14b, electric discharge can be similarly suppressed.

Figure 10:
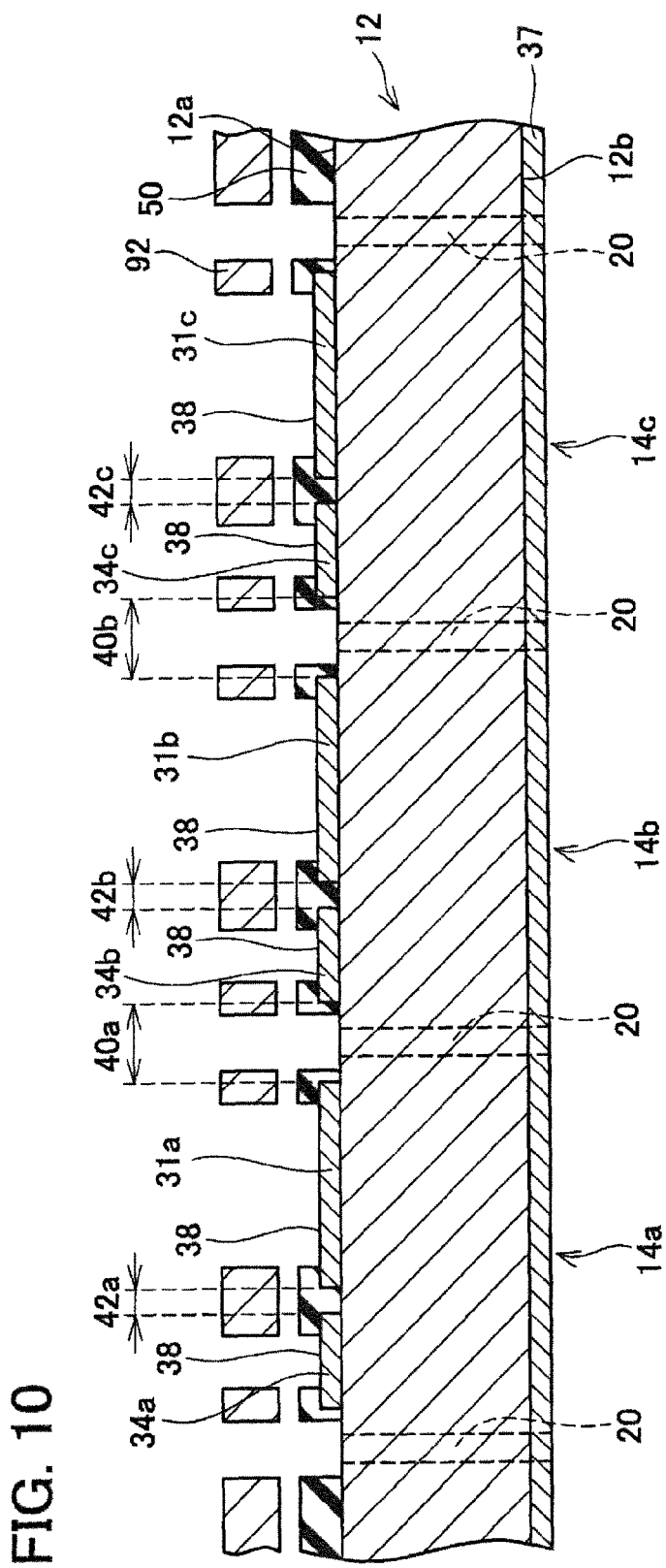
FIG. 10 is an explanatory diagram of an insulating layer removal step of the second embodiment.

(Insulating Layer Removal Step) At an insulating layer removal step, as depicted in FIG. 10, the insulating layer 50 is partially removed by sputtering the insulating layer 50 through a mask 92. The mask 92 includes openings. In this case, the openings are arranged above the dicing lines 20 and the electrodes 31 and 34. The openings above the electrodes 31 and 34 are arranged at the upper portions of the exposed regions 38 and the insulating layer 50 adjacent to the exposed regions 38. By sputtering the insulating layer 50 through the mask 92, the insulating layer 50 on the dicing lines 20 is removed and the insulating layer 50 on the electrodes 31 and 34 is partially removed. Thereby, the exposed regions 38 of the electrodes 31 and 34 are enlarged. Though not depicted, the exposed regions of the electrodes 32, 33, 35, and 36 are similarly enlarged. After an unnecessary portion of the insulating layer 50 is removed, the insulating layer 50 in its temporary hardening state is completely hardened by baking the semiconductor wafer 12.

(Dicing Step) A dicing step is executed similarly to that of the first embodiment. Thereby, the semiconductor devices including the semiconductor elements 14 are completed.

Figure 11:
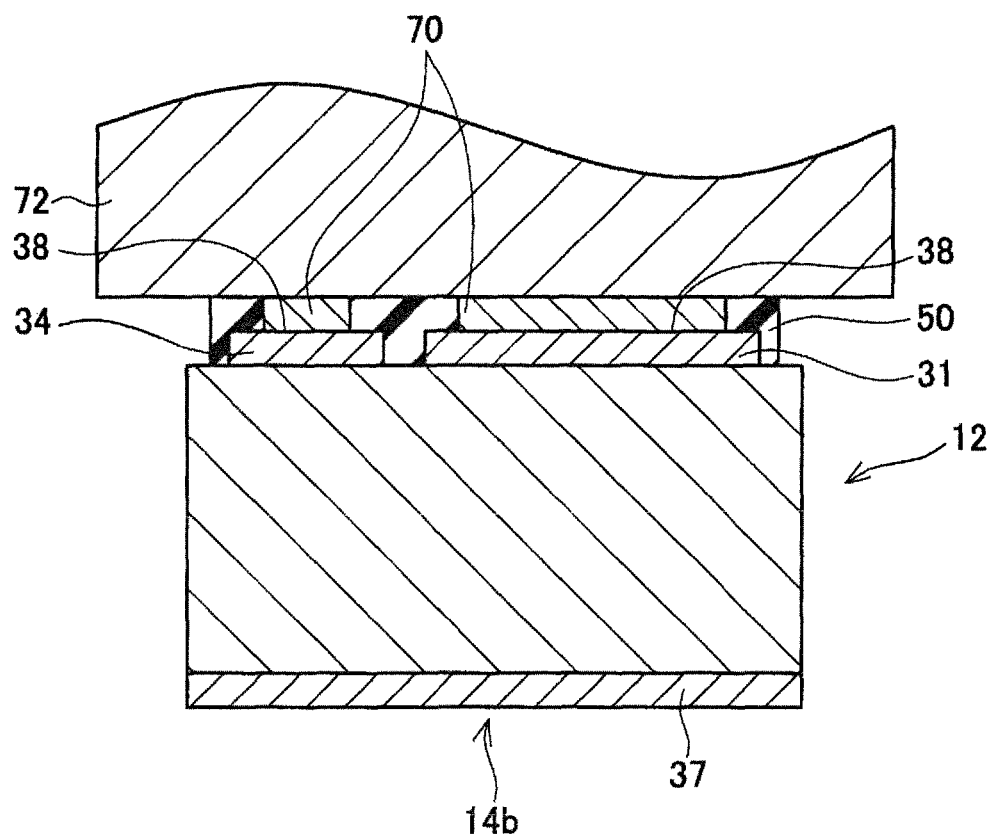
FIG. 11 is a diagram of a semiconductor device solder-bonded to a metal block 72.

As depicted in FIG. 11, the electrodes 31 to 36 on the top surface side of the semiconductor device manufactured using the method of the second embodiment can be connected to a metal block 72 by solder 70. Heat dissipation properties of the electrodes 31 to 36 are high because the exposed regions 38 of the electrodes 31 to 36 are enlarged in the insulating layer removal step.

As above, according to the method of the second embodiment, at the inspection step, electric discharge can further advantageously be suppressed because the distance is long between the exposed region 38 of each of the electrodes 31 and the exposed region 38 of each of the electrodes 34. The heat dissipation properties of the manufactured semiconductor device can be improved because the exposed region 38 of each electrode is expanded in the insulating layer removal step executed later.

According to the second embodiment, the electrodes 31 to 36 are connected to the metal block 72 by the solder 70. However, there is no limitation on how the electrodes 31 to 36 are connected to an external device. The heat dissipation properties of the semiconductor device can be improved by enlarging the exposed regions 38 of the electrodes 31 to 36 no matter how the electrodes 31 to 36 are connected to the external device.

According to the first and the second embodiments, the insulating layer 50 is removed by the sputtering in the insulating layer removal step. The insulating layer 50 may however be removed by another method. For example, the insulating layer 50 can be formed of a photosensitive polyimide resin. In this case, before the insulating layer removal step is executed, the insulating layer 50 in a range not to be removed can be hardened by applying a light beam to the insulating layer 50 in the range not to be removed, without the insulating layer 50 in a range to be removed being hardened. Thereafter, only the insulating layer 50 that was not hardened may be removed by etching, etc.

Third Embodiment

A method of a third embodiment will be described. According to the method of the third embodiment, a semiconductor element formation step, an insulating layer formation step, an inspection step, and an insulating layer removal step are executed similarly to those of the second embodiment.

Figure 12:
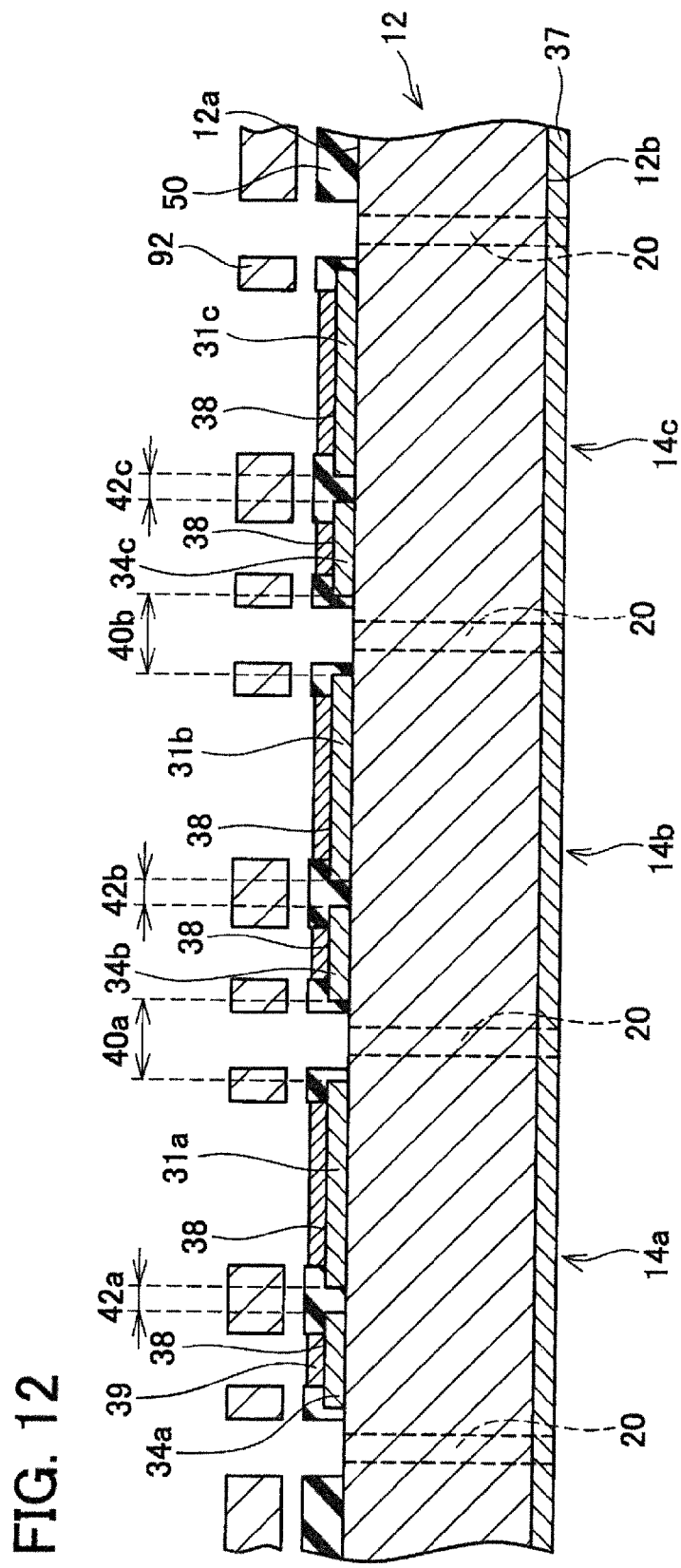
FIG. 12 is an explanatory diagram of a metal film growth step of a third embodiment.

(Metal Film Growth Step) According to the method of the third embodiment, a metal film growth step is executed after the insulating layer removal step is executed. At the metal film growth step, as depicted in FIG. 12, a metal film 39 (in this embodiment, a nickel film) is grown on the surfaces of the exposed regions 38 of the electrodes 31 to 36 by sputtering and employing a same mask as the mask 92 used at the insulating layer removal step. That is, a metal (that is, nickel) sputtering target is placed above the mask 92 and ions of argon, etc., are caused to collide with the sputtering target and, thereby, the metal film 39 is grown. Notably, a state where the mask 92 is fixed to the semiconductor wafer 12 is maintained from the insulating layer removal step to the metal film growth step.

After the metal film 39 is grown, a dicing step is executed similarly to that of the first embodiment. Thereby, semiconductor devices including the semiconductor elements 14 are completed.

According to the method of the third embodiment, the semiconductor device that has the metal film 39 formed on the surfaces of the electrodes 31 to 36 can be manufactured. A solder-wetting property of the electrodes 31 to 36 can be improved by forming the metal film 39 made of nickel. For example, as depicted in FIG. 11, the soldering of the electrodes 31 to 36 is therefore facilitated. Further, any misalignment of the mask, etc., can be prevented because the same mask is used in a state of being kept fixed at the insulating layer removal step and the metal film growth step.

According to the third embodiment, the metal film 39 is made of nickel. Alternatively, another metal having a high solder-wetting property may be implemented as the metal film 39. The other metal having the high solder-wetting property can be Au, Cu, . . . etc. Further, in addition to the metal film 39 or instead of the metal film 39, another metal film may be formed on the surfaces of the electrodes 31 to 36 for another purpose such as prevention of oxidation of the electrodes 31 to 36.

According to the method of the third embodiment, the metal film may be formed on the dicing lines 20 at the metal film growth step because the openings of the mask 92 are also disposed above the boundary portions 40. When the metal film on the dicing lines 20 causes a problem, another mask including no opening on the dicing lines 20 can be used at the metal film growth step.

In the first to the third embodiments, the dicing step is executed after the insulating layer 50 on the dicing lines 20 is removed. However, if the insulating layer 50 being undesirably cut by the dicing blade would not be a problem, the semiconductor wafer 12 may be cut together with the insulating layer 50 at the dicing step without removing the insulating layer 50 on the dicing lines 20.

In the first to the third embodiments, the insulating layer 50 is formed so as to cover the overall top surface 12a of the boundary portions 40. Alternatively, the insulating layer 50 does not necessarily need to cover the overall top surface 12a of the boundary portions 40. Even when the insulating layer 50 is adapted to cover a part of the top surface 12a of the boundary portions 40, any electric discharge on the boundary portions 40 can be suppressed compared to a case where the insulating layer 50 is not present.

In the first to the third embodiments, the insulating layer 50 is caused to remain on a part of the boundary portions 40 at the insulating layer removal step. Alternatively, the overall insulating layer 50 in the boundary portions 40 and the peripheries thereof may be removed at the insulating layer removal step. Further, the insulating layer 50 in the clearances 42 and the peripheries thereof may be removed at the insulating layer removal step.

In the first to the third embodiments, the electrodes 31 to 36 on the top surface side of each of the semiconductor elements 14 not to be inspected are set to be electrically floating at the inspection step. Alternatively, the electrodes 31 to 36 on the top surface side of the semiconductor element 14 not an inspection target may be fixed at a predetermined potential that is lower than the specific potential.

In the first to the third embodiments, the specific potential is a potential that is higher than the potential of the bottom surface electrode 37. Alternatively, the specific potential may be a potential that is lower than the potential of the bottom surface electrode 37. That is, an inspection for applying a voltage reverse to that of the inspection step of the embodiments may be executed in the inspection step.

Figure 13:
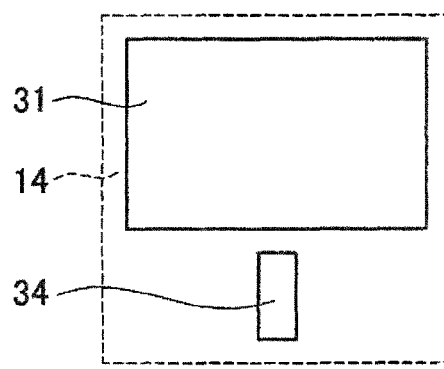
FIG. 13 is an enlarged diagram of a top surface of the semiconductor device 14 of another embodiment.
Figure 14:
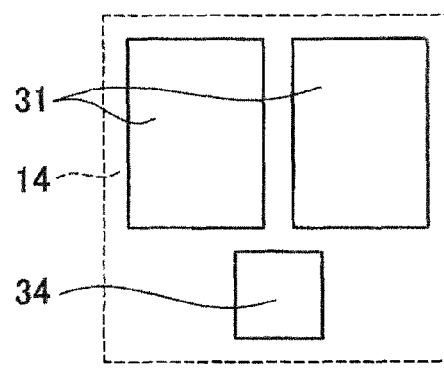
FIG. 14 is an enlarged diagram of a top surface of the semiconductor device 14 of another embodiment.
Figure 15:
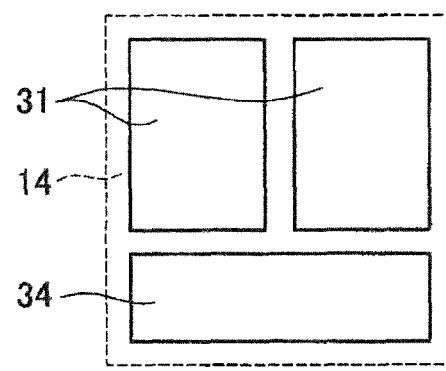
FIG. 15 is an enlarged diagram of a top surface of the semiconductor device 14 of another embodiment.

In the first to the third embodiments, the electrodes are disposed on the top surface 12a of the semiconductor element 14 as depicted in FIG. 3. Alternatively, a number and an arrangement of the electrodes can arbitrarily be changed. For example, the electrodes 31 and 34 may be arranged as depicted in each of FIGS. 13 to 15.

In the first to the third embodiments, each of the semiconductor elements 14 is an IGBT. Alternatively, each of the semiconductor elements 14 may be a diode, a MOSFET, etc. Further, the semiconductor element 14 may an element formed by combining two or more of an IGBT, a diode, and a MOSFET.

Correspondence relations will be described between the constituent elements of the embodiments and the constituent elements in claims. The electrode 31b of the embodiments is an example of a first electrode in claims. The electrode 34c of the embodiments is an example of a second electrode in claims. The electrode 31a of the embodiments is an example of a third electrode in claims. The electrode 34b of the embodiments is an example of a fourth electrode in claims. The semiconductor element 14b of the embodiments is an example of a first semiconductor element in claims. The semiconductor element 14c of the embodiments is an example of a second semiconductor element in claims. The semiconductor element 14a of the embodiments is an example of a third semiconductor element in claims. The boundary portion 40b of the embodiments is an example of a first boundary portion in claims. The boundary portion 40a of the embodiments is an example of a second boundary portion in claims. The clearance 42b of the embodiments is an example of a clearance in claims. The insulating layer 50 of the boundary portion 40b of the embodiments is an example of a first insulating layer in claims. The insulating layer 50 of the clearance 42 of the embodiments is an example of a second insulating layer in claims. The insulating layer 50 of the boundary portion 40a of the embodiments is an example of a third insulating layer in claims. The top surface 12a of the semiconductor wafer 12 which was exposed in the boundary portion 40b at the insulating layer removal step of the embodiments is an example of an exposed front surface in the first boundary portion of claims. The top surface 12a of the semiconductor wafer 12 which got exposed in the boundary portion 40a at the insulating layer removal step of the embodiments is an example of an exposed front surface in the second boundary portion of claims. The exposed region 38 of the electrode 31b of the embodiments is an example of an exposed region of the first electrode in claims. The exposed region 38 of the electrode 34b of the embodiments is an example of an exposed region of the fourth electrode of claims.

The embodiments have been described in detail in the above. However, these are only examples and do not limit the claims. The technology described in the claims includes various modifications and changes of the concrete examples represented above.

The technical elements explained in the present description or drawings exert technical utility independently or in combination of some of them, and the combination is not limited to one described in the claims as filed. Moreover, the technology exemplified in the present description or drawings achieves a plurality of objects at the same time, and has technical utility by achieving one of such objects.

What is claimed is:

1. A method for manufacturing a semiconductor device, the method comprising:
forming a first semiconductor element and a second semiconductor element in a semiconductor wafer, the first semiconductor element including a first electrode formed on a front surface of the semiconductor wafer, and the second semiconductor element being adjacent to the first semiconductor element and including a second electrode formed on the front surface;
forming a first insulating layer on the front surface located at a first boundary portion between the first electrode and the second electrode;
applying a specific potential different from a potential of the second electrode on the first electrode after the formation of the first insulating layer;
removing at least a part of the first insulating layer after the application of the specific potential so as to expose at least a part of the front surface located in the first boundary portion by sputtering the first insulating layer through a mask having an opening located above the first insulating layer located on the first boundary portion and an opening located above an exposed region of the first electrode;
growing a metal layer on the exposed region of the first electrode through the mask after the removal of at least the part of the first insulating layer; and
cutting the semiconductor wafer at a region of the semiconductor wafer including the exposed front surface in the first boundary portion so as to divide the first semiconductor element from the second semiconductor element.

2. The method of claim 1, wherein
in the formation of the first insulating layer, the first insulating layer is formed so that a part of the first electrode located on a first boundary portion side is covered with the first insulating layer,
in the application of the specific potential, a probe is caused to make contact with an exposed region of the first electrode so as to apply the specific potential on the first electrode, and
in the removal of at least the part of the first insulating layer, at least a part of the first insulating layer located on the first electrode is removed so as to enlarge the exposed region of the first electrode.

3. The method of claim 2, wherein
the first semiconductor element further includes a fourth electrode formed on the front surface and located at an opposite side from the second electrode with respect to the first electrode,
in the formation of the first insulating layer, a second insulating layer is further formed on the front surface located in a clearance between the first electrode and the fourth electrode so that a part of the first electrode on a clearance side is covered with the second insulating layer, and
in the application of the specific potential, a distance from an edge of the exposed region of the first electrode on the first boundary portion side to an edge of the first electrode on the first boundary portion side is longer than a distance from an edge of the exposed region of the first electrode on the clearance side to an edge of the first electrode on the clearance side.

4. The method of claim 3, wherein
in the formation of the first semiconductor element and the second semiconductor element, a third semiconductor element is further formed in the semiconductor wafer, the third semiconductor element being adjacent to the first semiconductor element at an opposite side from the second semiconductor element, and including a third electrode formed on the front surface,
in the formation of the first insulating layer, a third insulating layer is further formed on the front surface located in a second boundary portion between the third electrode and the fourth electrode so that a part of the fourth electrode on a second boundary portion side is covered with the third insulating layer, and the second insulating layer is formed so that a part of the fourth electrode on the clearance side is covered with the second insulating layer,
in the application of the specific potential, a probe is caused to make contact with an exposed region of the fourth electrode so as to apply the specific potential on the fourth electrode, and a distance from an edge of the exposed region of the fourth electrode on the second boundary portion side to an edge of the fourth electrode on the second boundary portion side is longer than a distance from an edge of the exposed region of the fourth electrode on the clearance side to an edge of the fourth electrode on the clearance side,
in the removal of at least the part of the first insulating layer, at least a part of the third insulating layer is further removed so as to expose at least a part of the front surface located in the second boundary portion and enlarge the exposed region of the fourth electrode, and
in the cutting of the semiconductor wafer, a region of the semiconductor wafer including the exposed front surface in the second boundary portion is cut so as to divide the first semiconductor element from the third semiconductor element.

5. The method of claim 1, wherein
the first semiconductor element further includes a rear surface electrode formed on a rear surface of the semiconductor wafer, and
in the application of the specific potential, a potential different from the specific potential is applied on the rear surface electrode.

6. A method for manufacturing a semiconductor device, the method comprising:
forming a first semiconductor element and a second semiconductor element in a semiconductor wafer, the first semiconductor element including a first electrode formed on a front surface of the semiconductor wafer, and the second semiconductor element being adjacent to the first semiconductor element and including a second electrode formed on the front surface;
forming a first insulating layer on the front surface located at a first boundary portion between the first electrode and the second electrode such that a part of the first electrode located on a first boundary portion side is covered with the first insulating layer;
applying a specific potential different from a potential of the second electrode on the first electrode after the formation of the first insulating layer;
removing at least a part of the first insulating layer after the application of the specific potential so as to expose at least a part of the front surface located in the first boundary portion such that at least a part of the first insulating layer located on the first electrode is removed so as to enlarge the exposed region of the first electrode; and
cutting the semiconductor wafer at the first boundary portion so as to divide the first semiconductor element from the second semiconductor element.

7. The method of claim 6, further comprising:
wherein, in the cutting of the semiconductor wafer, a region of the semiconductor wafer including the exposed front surface in the first boundary portion is cut.

8. The method of claim 7, wherein
in the application of the specific potential, a probe is caused to make contact with an exposed region of the first electrode so as to apply the specific potential on the first electrode.

9. The method of claim 8, wherein
the first semiconductor element further includes a fourth electrode formed on the front surface and located at an opposite side from the second electrode with respect to the first electrode,
in the formation of the first insulating layer, a second insulating layer is further formed on the front surface located in a clearance between the first electrode and the fourth electrode so that a part of the first electrode on a clearance side is covered with the second insulating layer, and
in the application of the specific potential, a distance from an edge of the exposed region of the first electrode on the first boundary portion side to an edge of the first electrode on the first boundary portion side is longer than a distance from an edge of the exposed region of the first electrode on the clearance side to an edge of the first electrode on the clearance side.

10. The method of claim 9, wherein
in the formation of the first semiconductor element and the second semiconductor element, a third semiconductor element is further formed in the semiconductor wafer, the third semiconductor element being adjacent to the first semiconductor element at an opposite side from the second semiconductor element, and including a third electrode formed on the front surface,
in the formation of the first insulating layer, a third insulating layer is further formed on the front surface located in a second boundary portion between the third electrode and the fourth electrode so that a part of the fourth electrode on a second boundary portion side is covered with the third insulating layer, and the second insulating layer is formed so that a part of the fourth electrode on the clearance side is covered with the second insulating layer,
in the application of the specific potential, a probe is caused to make contact with an exposed region of the fourth electrode so as to apply the specific potential on the fourth electrode, and a distance from an edge of the exposed region of the fourth electrode on the second boundary portion side to an edge of the fourth electrode on the second boundary portion side is longer than a distance from an edge of the exposed region of the fourth electrode on the clearance side to an edge of the fourth electrode on the clearance side,
in the removal of at least the part of the first insulating layer, at least a part of the third insulating layer is further removed so as to expose at least a part of the front surface located in the second boundary portion and enlarge the exposed region of the fourth electrode, and in the cutting of the semiconductor wafer, a region of the semiconductor wafer including the exposed front surface in the second boundary portion is cut so as to divide the first semiconductor element from the third semiconductor element.

* * * * *